(12) United States Patent
Fussinger et al.

(10) Patent No.: US 8,661,681 B2
(45) Date of Patent: Mar. 4, 2014

(54) METHOD OF FABRICATING A MICRO-MECHANICAL COMPONENT

(75) Inventors: Alexandre Fussinger, Wavre (CH); Marco Verardo, Les Bois (CH)

(73) Assignee: Nivarox-FAR S.A., Le Locle (CH)

( * ) Notice: Subject to any disclaimer, the term of this patent is extended or adjusted under 35 U.S.C. 154(b) by 139 days.

(21) Appl. No.: 13/130,698

(22) PCT Filed: Nov. 4, 2009

(86) PCT No.: PCT/EP2009/064639
§ 371 (c)(1),
(2), (4) Date: May 23, 2011

(87) PCT Pub. No.: WO2010/057777
PCT Pub. Date: May 27, 2010

(65) Prior Publication Data
US 2011/0225801 A1    Sep. 22, 2011

(30) Foreign Application Priority Data

Nov. 21, 2008    (EP) .................................... 08169687

(51) Int. Cl.
*G04D 3/00*    (2006.01)

(52) U.S. Cl.
USPC .............................. 29/896.3; 29/418; 29/467

(58) Field of Classification Search
USPC ............ 29/467, 418, 412, 896.31, 896.3, 893
See application file for complete search history.

(56) References Cited

U.S. PATENT DOCUMENTS

| | | | |
|---|---|---|---|
| 640,546 A * | 1/1900 | Hart ................................. 30/487 |
| 4,400,861 A * | 8/1983 | Parker ........................... 148/518 |
| 6,082,001 A | 7/2000 | Bettelini | |
| 6,519,853 B1 * | 2/2003 | Machida et al. ............. 29/896.3 |
| 7,618,183 B2 * | 11/2009 | Meister et al. ................ 368/324 |
| 7,735,216 B2 * | 6/2010 | Schnabel et al. ................ 29/740 |
| 8,354,032 B2 * | 1/2013 | Dinger et al. ...................... 216/2 |
| 2008/0111445 A1 * | 5/2008 | Paratte et al. ................. 310/309 |
| 2008/0198702 A1 * | 8/2008 | Meister et al. ................ 368/232 |
| 2010/0054092 A1 | 3/2010 | Marmy et al. | |
| 2010/0251549 A1 * | 10/2010 | Tamai ............................ 29/893 |

FOREIGN PATENT DOCUMENTS

| | | |
|---|---|---|
| CH | 276 772 | 7/1951 |
| EP | 0 994 398 | 4/2000 |
| EP | 1 035 453 | 9/2000 |

(Continued)

OTHER PUBLICATIONS

A. Perret et al. Proceeding from SPIE. vol. 4755, 2002, pp. 645-647.*

(Continued)

*Primary Examiner* — David Bryant
*Assistant Examiner* — Justin Sikorski
(74) *Attorney, Agent, or Firm* — Griffin & Szipl, P.C.

(57) ABSTRACT

The invention relates to a method (1) of fabricating a micromechanical component that includes the following step:
  b) forming (3) at least one plate that includes a frame connected by at least one bridge of material to a part of said component, wherein said part has a hole.

According to the invention, the method (1) also includes the following steps:
  e) stacking (5) said at least one plate against a support;
  f) securing (7) a pin in the hole of said at least one stacked part so as to form the component;
  g) releasing (9) the component formed from each plate.

The invention concerns the field of watchmaking.

15 Claims, 6 Drawing Sheets

(56) References Cited

FOREIGN PATENT DOCUMENTS

| EP | 1 921 042 | 5/2008 |
| GB | 658 890 | 10/1951 |
| JP | 11048342 A * | 2/1999 |
| WO | 2005/079128 A1 | 8/2005 |
| WO | 2008/055844 A1 | 5/2008 |
| WO | 2009/093741 A1 | 7/2009 |

OTHER PUBLICATIONS

International Search Report issued in corresponding application PCT/EP2009/064639, completed Jan. 27, 2010 and mailed Feb. 2, 2010.

* cited by examiner

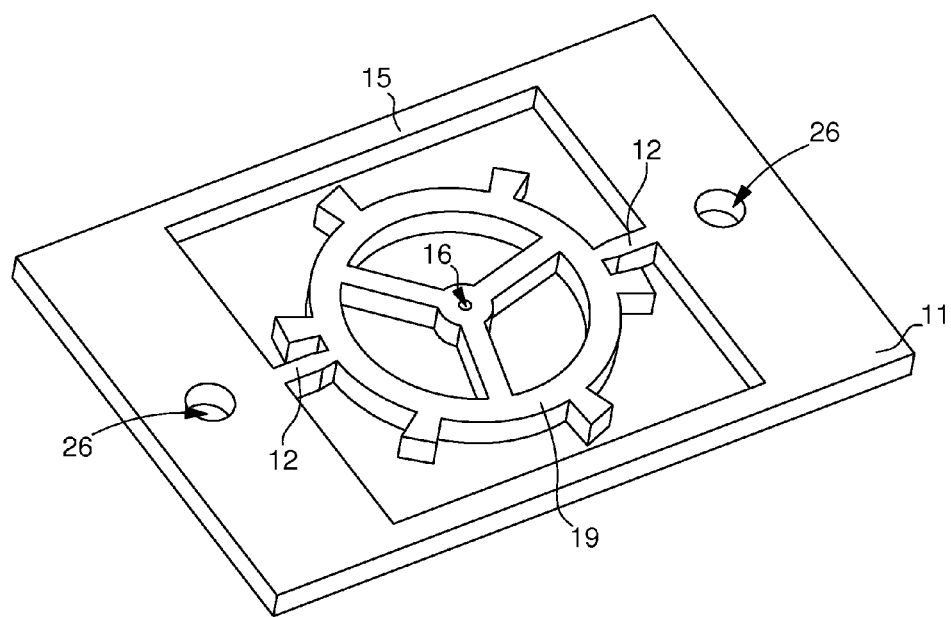
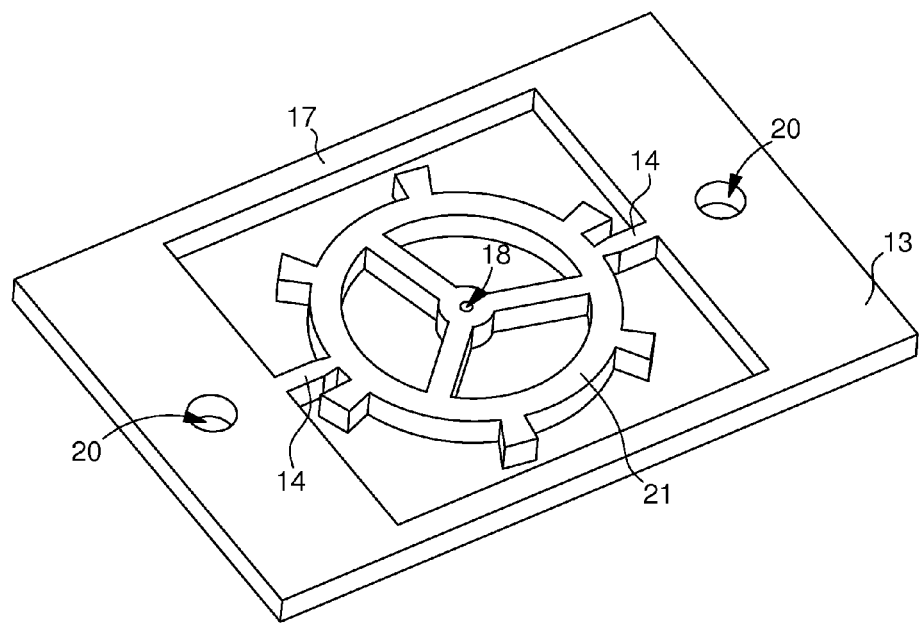
Fig. 1

METHOD OF FABRICATING A MICRO-MECHANICAL COMPONENT

This is a National Phase Application in the United States of International Patent Application PCT/EP2009/064639 filed Nov. 4, 2009, which claims priority on European Patent Application No. 08169687.4 of Nov. 21, 2008. The entire disclosures of the above patent applications are hereby incorporated by reference.

FIELD OF THE INVENTION

The invention relates to a method of fabricating a micro-mechanical component and, more specifically, a method of this type for assembling micro-machined and/or electro-formed components.

BACKGROUND OF THE INVENTION

It is advantageous in the watchmaking industry to fabricate components or parts of components by using a micro-machining process, for example photolithography then deep reactive ion etching, or electroplating, for example photolithography then galvanic growth. These processes make fabrication with improved precision possible, compared to conventional techniques.

However, it is difficult to form components from several parts. Thus, in the case of electroformed components, a laser weld between two parts and, for example, an arbour, is liable to deform the parts and arbour so that the very high level of precision resulting from the electroplating process is lost. Moreover, whatever the process, it is very difficult to obtain assembly precision between two components and, for example, a pivoting arbour.

SUMMARY OF THE INVENTION

It is an object of the present invention to overcome all or part of the aforementioned drawbacks by proposing a method of fabricating a micro-mechanical component that includes, for example, at least three parts, wherein the precision of the processes is not altered by the assembly precision of the parts. The invention therefore relates to a method of fabricating a micro-mechanical component with several levels includes the following steps: (a) forming at least two plates that each include a frame connected by at least one bridge of material to one part of the component; characterized in that it further includes the following steps: (b) stacking the at least two plates against a support so as to stack at least two of the parts; (c) securing a pin in a hole of each of the at least two stacked parts so as to form the component with a single pin protruding from at least one of the stacked plates so as to use it as gripping means; and (d) releasing the formed component from the at least two plates. Advantageously according to the invention, it is possible to fabricate a part from any process (micro-machining, electroforming, electroerosion, stamping) without handling the part itself, but only the frame and the pin, prior to final assembly of the part. Moreover, the support is used as a guide for fabricating the final component in a more precise manner while still maintaining the precision of the process (micro-machining, electroforming, electroerosion, stamping) used to make each part during step (a).

According to other advantageous features of the invention, summarized as follows: (i) for each plate, step (b) includes the following steps: (e), guiding the plate using alignment means to orient the plate reliably relative to the support, and (f), sliding the plate against at least one arbour secured to the support until it abuts against a shoulder of the arbour so that the plate is placed reliably relative to the support; (ii) each of the alignment means includes at least one bevelled ring, which is mounted in the extension of the at least one arbour of the support, and which cooperates with a recess made in each of the at least two plates during step (a); (iii) at least two alignment means are used in step (e) to improve guiding reliability; (iv) each recess is made in the frame of the at least two plates or consists of a space between the frame and the part of each of the at least two plates; (v) each at least one bridge of material includes a narrow section at the end connected to the part of the component so as to create a weak area that can facilitate step (d); (vi) several parts are formed on each plate so as to form several components in step (c); (vii) the pin is extended at each of its ends by a pivot-shank that includes a pivot so as to form a pivoting arbour; (viii) the pin includes a coaxial ring used as a stop member for limiting the penetration of the pin into the holes; (ix) the coaxial ring has a toothing so as to form a pinion; (x) at least one of the plates is formed in step (a) using an electroplating and/or micro-machining process; and (xi) at least one sub-part can be mounted on at least one of the parts laterally relative to the plate prior to, during or after step (b).

Thus, in accordance with a first non-limiting illustrative embodiment of the present invention, a method (1) of fabricating a micro-mechanical component (31, 41, 51) is provided that includes the following steps: (a) forming (3) at least one plate (11, 13) that includes a frame (15, 17) connected by at least one bridge of material (12, 14) to a part (19, 21) of the component, wherein the part (19, 21) has a hole (16, 18), characterized in that the method further includes the following steps: (b) stacking (5) the at least one plate against a support (23); (c) securing (7) a pin (29) in the hole (16, 18) of the at least one stacked part so as to form the component (31, 41, 51) using gripping means; and (d) releasing (9) the formed component (31, 41, 51) from the at least one plate (11, 13). In accordance with a second non-limiting illustrative embodiment of the present invention, the first non-limiting embodiment is modified so that step (a) forms (3) at least two plates (11, 13); step (b) stacks (5) the at least two plates against the support (23) so as to stack at least two of the parts; step (c) secures (7) a pin (29) in the hole (16, 18) of each of the at least two stacked parts so as to form the component (31, 41, 51); and step (d) releases (9) the formed component (31, 41, 51) from each plate (11, 13).

In accordance with a third non-limiting illustrative embodiment of the present invention, the first and second non-limiting embodiments are further modified so that step (b) includes the following steps for each plate (11, 13): (i) guiding (B) the plate using alignment means (25) so as to orient the plate accurately relative to the support (23); and (ii) sliding (A) the plate against at least one arbour (22) secured to the support (23) until the plate abuts against a shoulder (24) of the arbour so as to place the plate accurately relative to the support (23). In accordance with a fourth non-limiting illustrative embodiment of the present invention, the third non-limiting embodiment is further modified so that each of the alignment means includes at least one bevelled ring, which is mounted in the extension of the at least one arbour of the support (23), and which cooperates with a recess (20, 26) made in each of the at least two plates in step (a). In accordance with a fifth non-limiting illustrative embodiment of the present invention, the third and fourth non-limiting embodiments are further modified so that the guiding operation in step (e) is performed using at least two alignment means (25) so as to improve the accuracy of the guiding.

In accordance with a sixth non-limiting illustrative embodiment of the present invention, the fourth and fifth non-limiting embodiments are further modified so that each recess (20, 26) is made in the frame (15, 17) of the at least two plates. In accordance with a seventh non-limiting illustrative embodiment of the present invention, the fourth and fifth non-limiting embodiments are further modified so that each recess is a space between the frame (15, 17) and the part (19, 21) of each of the at least two plates.

In accordance with an eighth non-limiting illustrative embodiment of the present invention, the first, second, third, fourth, fifth, sixth and seventh non-limiting embodiments are further modified so that each at least one bridge of material (12, 14) includes a narrow section at the end that is connected to the part of the component, so as to create an area of weakness that can facilitate step (d). In accordance with a ninth non-limiting illustrative embodiment of the present invention, the first, second, third, fourth, fifth, sixth, seventh and eighth non-limiting embodiments are further modified so that several parts (19, 21) are formed on each plate (11, 13) so as to form several components (31, 41, 51) in step (c). In accordance with a tenth non-limiting illustrative embodiment of the present invention, the first, second, third, fourth, fifth, sixth, seventh, eighth and ninth non-limiting embodiments are further modified so that the pin (29) is extended at each end thereof by a pivot-shank that includes a pivot to form a pivoting arbour. In accordance with an eleventh non-limiting illustrative embodiment of the present invention, the first, second, third, fourth, fifth, sixth, seventh, eighth, ninth and tenth non-limiting embodiments are further modified so that the pin (29) has a coaxial ring (30) used as a stop member for limiting the penetration of the pin in the holes. In accordance with a twelfth non-limiting illustrative embodiment of the present invention, the eleventh non-limiting embodiment is further modified so that the coaxial ring (30) has a toothing so as to form a pinion.

In accordance with a thirteenth non-limiting illustrative embodiment of the present invention, the first, second, third, fourth, fifth, sixth, seventh, eighth, ninth, tenth, eleventh and twelfth non-limiting embodiments are further modified so that at least one of the plates is formed in step (a) using an electroplating process. In accordance with a fourteenth non-limiting illustrative embodiment of the present invention, the first, second, third, fourth, fifth, sixth, seventh, eighth, ninth, tenth, eleventh, twelfth and thirteenth non-limiting embodiments are further modified so that at least one of the plates is formed in step (a) using a micro-machining process. In accordance with a fifteenth non-limiting illustrative embodiment of the present invention, the first, second, third, fourth, fifth, sixth, seventh, eighth, ninth, tenth, eleventh, twelfth, thirteenth and fourteenth non-limiting embodiments are further modified so that at least one sub-part is mounted laterally on at least one of the parts relative to the plate before, during or after step (b).

BRIEF DESCRIPTION OF THE DRAWINGS

Other features and advantages will appear more clearly from the following description, given by way of non-limiting illustration, with reference to the annexed drawings, in which:

FIG. 1 is a schematic diagram of two plates according to the invention;

DETAILED DESCRIPTION OF PREFERRED EMBODIMENTS

Figure 8:
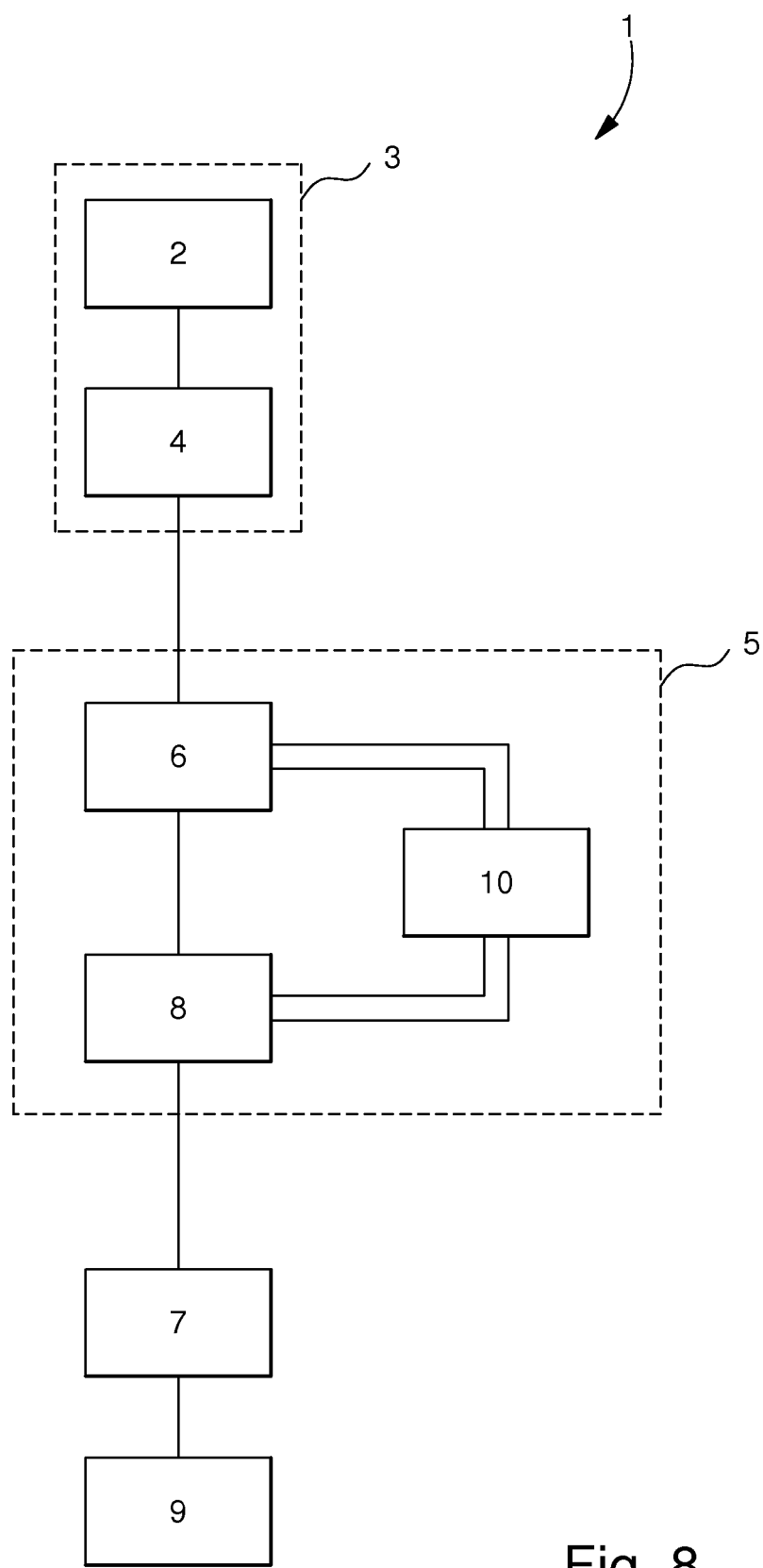
FIG. 8 is a flow chart of the method according to the invention.

As illustrated in FIG. 8, the invention relates to a method 1 of fabricating a micro-mechanical component 31, 41, 51. Method 1 is for securely assembling at least two distinct parts 19, 21 by stacking them using a pin 29. Method 1 includes a step 3 of making parts 19, 21 of the final component 31, 41, 51, a step 5 of stacking the plates 11, 13 that include the parts, a step 7 of securing the parts, then a step 9 of releasing the component 31, 41, 51 thereby formed from plates 11, 13.

Advantageously according to the invention, the first step 3 of making parts 19, 21 of component 31, 41, 51 can be performed using a micro-machining and/or electroplating process. A micro-machining process, i.e. a process with machining precision approximately equal to or less than a micron, may comprise, for example, photolithography, to form a protective mask on a plate of micro-machinable material, then an etch of the unprotected parts of the plate, for example, deep reactive ion etching. A micro-machinable material may thus consist, for example, of a silicon, crystallised silica or crystallised alumina based material. Of course, other materials may be used.

An electroplating process may include, for example, photolithography, to form a mould in which galvanic growth is carried out. A galvanic growth material may thus consist, for example, of a metal material like pure nickel or nickel-phosphorus. Of course other materials may be used.

Manufacturing step 3 includes at least two distinct formation phases 2, 4. Each phase 2, 4 using the micro-machining and/or electroplating processes is for forming a respective plate 11, 13 as illustrated in FIG. 1. Each plate 11, 13 includes a frame 15, 17 connected by at least one bridge of material 12, 14 to a part 19, 21 to be used for fabricating the final component 31, 41, 51. As is visible in FIG. 1, each part 19, 21 preferably includes a through hole 16, 18.

It is thus clear that the final component 31, 41, 51 can be made, either from the same process, or from several different processes. Of course, processes other than micro-machining and/or electroplating, capable of fabricating these plates 11, 13, etc., can be used, such as electroerosion or stamping.

According to the invention, method 1 includes a second step 5 for stacking plates 11, 13 against a support 23. In the example illustrated in FIGS. 2 to 4, support 23 includes at least one arbour 22 for cooperating with an associated recess 20, 26, which is made in the plate 13, 11 to be stacked. This assembly of arbour 22—recess 20, 26 enables plate 13, 11 to be precisely positioned relative to support 23.

Preferably, according to the invention, each arbour 22 has a shoulder 24 to make the distance between plate 13, 11 and support 23 more accurate. Support 23 preferably also includes alignment means 25 for reliably orienting plate 13, 11 relative to support 23. In the example illustrated in FIGS. 2 to 4, alignment means 25 include a bevelled ring mounted in the extension of each arbour 22 for cooperating with one of recesses 20, 26 made in plate 13, 11.

Figure 2:
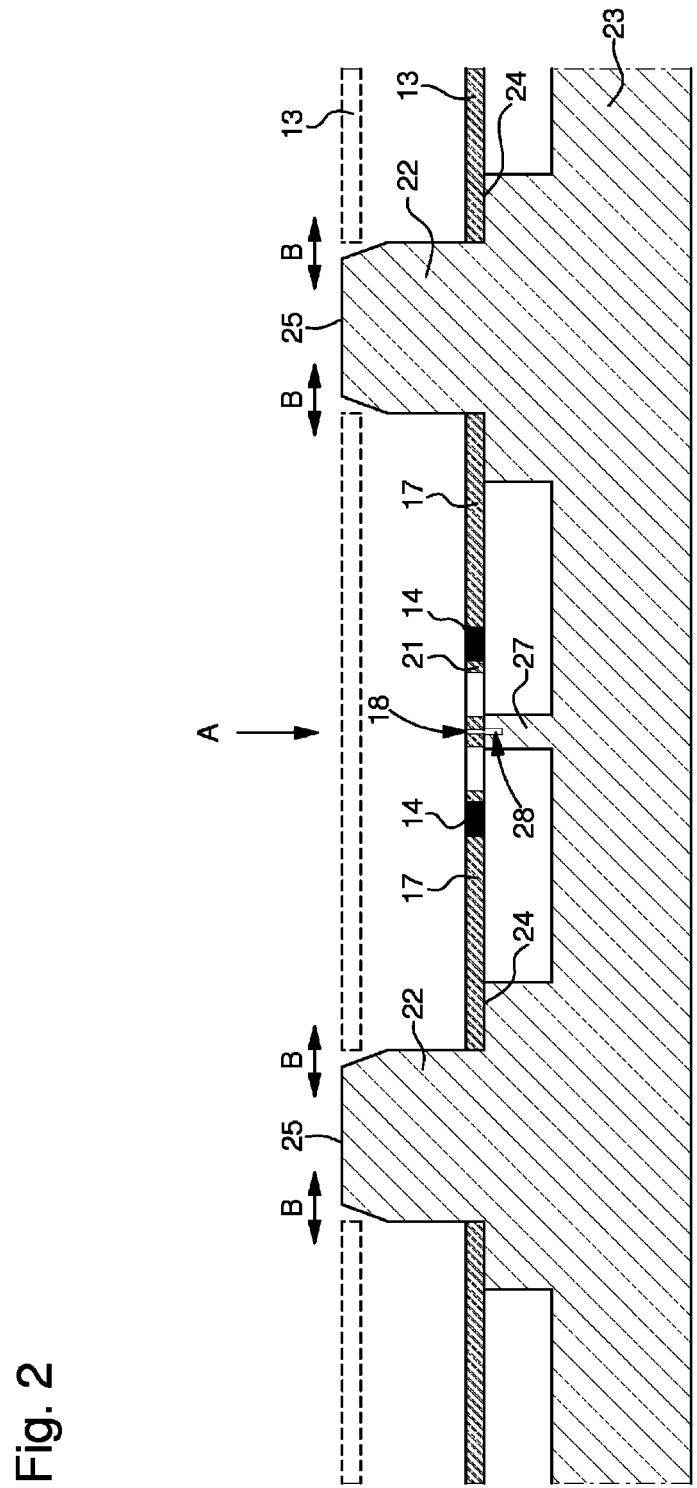
FIGS. 2 to 4 are schematic diagrams of successive steps of the method of the invention.

In a first phase 6 of second step 5 illustrated in FIG. 2, a first plate 13 is mounted against support 23. First of all, plate 13 is moved closer to support 23 along direction A. Secondly, plate 13, illustrated by dotted lines, meets alignment means 25 which guide it along direction B. Alignment means 25 and recesses 20 orient plate 13 accurately so that recesses 20 are placed plumb with each arbour 22 of support 23. Thirdly, plate 13 is slid along direction A by means of its recesses 20 against their arbour 22 until it comes into contact, finally, with shoulders 24 of each arbour 22, as illustrated in FIG. 2. It is thus clear that plate 13 is very precisely positioned relative to support 23.

Figure 3:
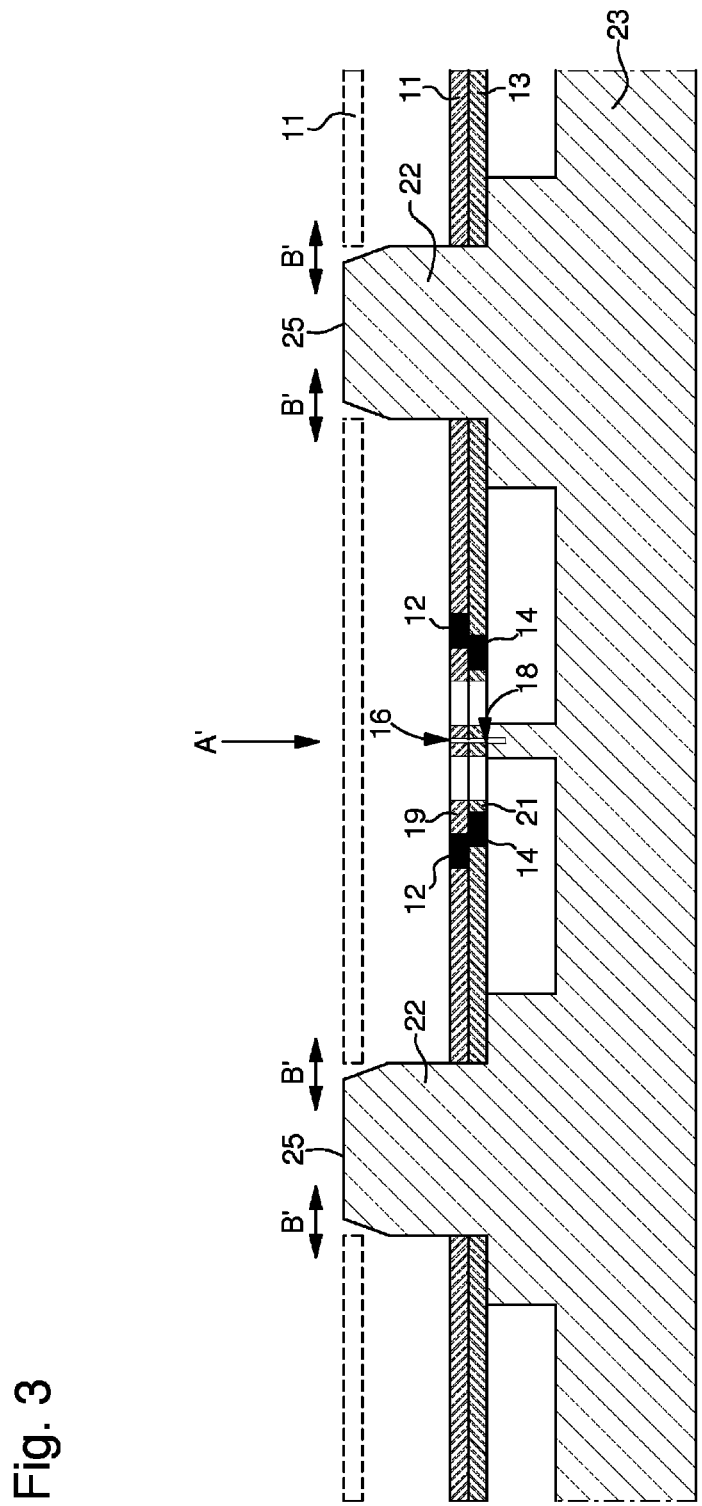

In a second phase 8 of second step 5 illustrated in FIG. 3, a second plate 11 is mounted against support 23, by being stacked relative to first plate 13. First of all, plate 11 is moved closer to support 23 along direction A'. Secondly, plate 11, illustrated by dotted lines, meets alignment means 25 which guide it along direction B'. Alignment means 25 and recesses 26 orient plate 11 accurately so that recesses 26 are placed plumb with each arbour 22 of support 23. Next, plate 11 is slid along direction A' by means of its recesses 26 against their arbour 22 until it comes into contact, finally, with the top of first plate 13, as illustrated in FIG. 3.

It is thus clear that plates 11 and 13 are very precisely positioned relative to support 23, and, incidentally, in relation to each other. It will also be noted that part 21 of plate 13 is located underneath and in contact with part 19 of plate 11. Finally, it can also be seen that, in the example illustrated in FIG. 3, holes 16 and 18 are approximately aligned plumb with each other.

Of course, first and second steps 3 and 5 are not limited to making and stacking two single plates 11 and 13. Indeed, method 1 advantageously enables more or fewer than two plates to be made in step 3 so as to fabricate a component 31, 41, 51 from more or fewer than two stacked parts on support 23 in step 5. It is also clear that more or fewer phases 2, 4 are necessary in step 3 and more or fewer phases 6, 8 are necessary in step 5.

According to the invention, method 1 includes a third step 7 for securing each of the stacked parts 19, 21 to form micromechanical component 31, 41, 51. Preferably, according to the invention, securing step 7 is achieved by mounting a pin 29 in holes 16, 18 of each part 19, 21. Thus support 23 preferably also includes a post 27 with a hollow top portion 28 to prevent any relative movement between parts 19, 21 and their plates 11, 13 when pin 29 is inserted into their respective holes 16, 18. Indeed, any such relative movement would involve a risk of breaking bridges of material 12, 14 that is undesirable in this third step 7 of method 1.

Depending upon the nature of the materials used to make plates 11, 13, etc., several embodiments of third step 7 could be envisaged. Thus, according to the invention, the preferred embodiments are driving in, welding and bonding. Of course, if one of plates 11, 13, etc., is made of a material with no or very limited plastic deformation domain, it will be difficult to perform a driving in operation.

Figure 4:
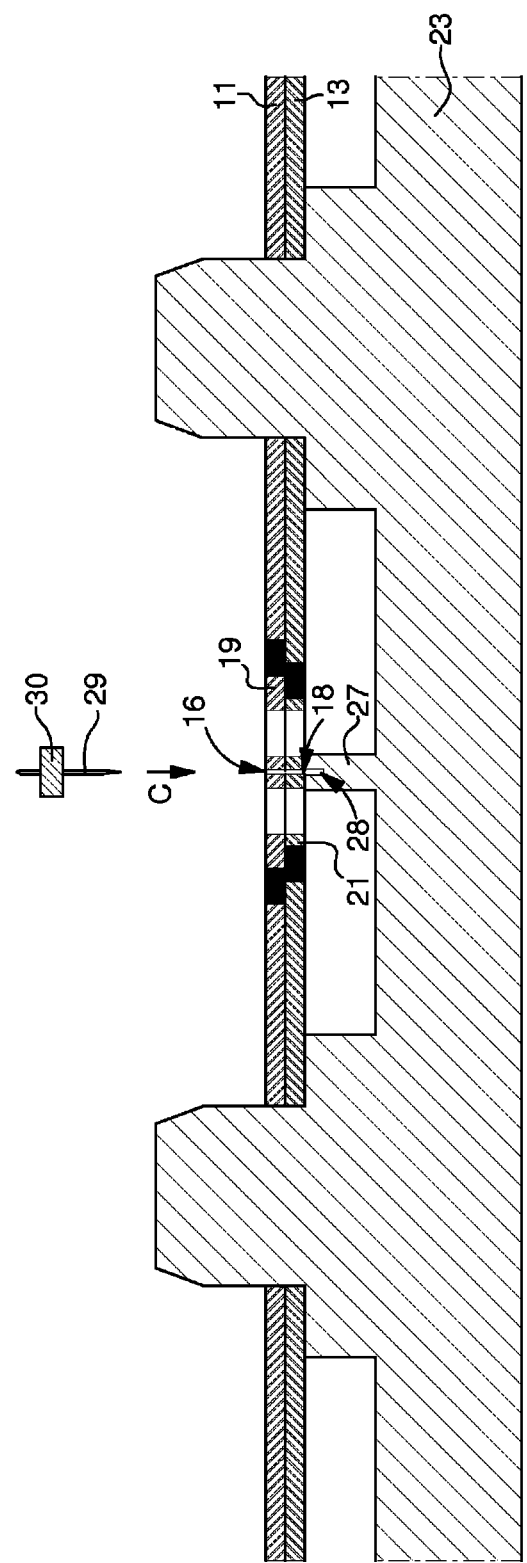

In a first, embodiment, related to driving, in the example illustrated in FIG. 4, first of all in third step 7, pin 29 is moved closer along direction C to each of stacked holes 16, 18. Secondly, pin 29 is forcibly driven into holes 16 then 18 of plates 11 and 13. Advantageously, the driving in force can be adjusted using an automaton. Each part 19, 21 is thus secured to pin 29 and forms the final component 31, 41, 51.

In a second weld-related embodiment, in the example illustrated in FIG. 4, first of all in third step 7, pin 29 is coated with a solder. Secondly, pin 29 is moved closer along direction C to each of the stacked holes 16, 18. Next, pin 29 is inserted into holes 16, then 18 of plates 11 and 13. Advantageously, the accuracy of direction C can be improved by using an automaton. Subsequently, the solder is solidified, for example, using a heat treatment. Each part 19 and 21 is thus secured to pin 29 and forms the final component 31, 41, 51.

In a third bonding-related embodiment, in the example illustrated in FIG. 4, first of all, in third step 7, pin 29 is coated with an adhesive material, for example a polymer adhesive. Secondly, pin 29 is moved closer along direction C to each of the stacked holes 16, 18. Next, pin 29 is inserted into holes 16, then 18 of plates 11 and 13. Advantageously, the accuracy of direction C can be improved by using an automaton. Subsequently, the adhesive material is activated, for example, by being heated. Each part 19 and 21 is thus secured to pin 29 and forms the final component 31, 41, 51.

According to the invention, method 1 includes a fourth step 9 of releasing the micro-mechanical component 31, 41, 51 formed from each of the plates 19, 21, etc. stacked in second step 5. Step 9 is preferably achieved by exerting a force capable of breaking bridges of material 12, 14.

Preferably, for all of the embodiments of third step 7, pin 29 is secured so that it projects from at least one of the stacked plates and can be used as gripping means, i.e. so that parts 19, 21, etc. of each plate 11, 13, etc. do not have to be handled. Advantageously, method 1 thus makes high surface quality possible for each of the parts. It is also clear that the top hollow part 28 of post 27, mounted on support 23, enables pin 29 to go beyond the bottom of plate 13 and/or limits the extent to which the pin is driven into holes 16, 18, etc.

According to a first variant of the invention, pin 29 has a ring 30 that forms a stop member on the projecting part so as to limit how far pin 29 penetrates the holes in the parts. Ring 30 thus provides an improvement in manufacturing quality. Moreover, ring 30 which can be integral with pin 29 may also, advantageously, comprise a toothing that can form a pinion as explained below.

According to a second variant of the invention, in addition to ring 30, pin 29 can also be extended at each of its ends by a pivot-shank that includes a pivot so as to form a pivoting arbour. Advantageously, according to the invention, it is thus clear that it is possible, in third step 7, to secure a multitude of elements in the holes of the stacked parts, which may vary from a simple pin 29 to a pivoting arbour fitted with at least one pinion.

Upon reading method 1, it is clear that it is possible to form several identical, or non-identical parts 19, 21, etc. on each plate 11, 13, etc. so as to mass produce identical or non-identical final components 31, 41, 51. It is also clear that, after third step 7, plates 11, 13, etc. can be delivered straight to the production lines, of, for example, timepiece movements before fourth step 9 is carried out. The advantage of this is that it is only the frames 15, 17, etc. of plates 11, 13, etc. of many final components that are handled at the same time, without any risk of the stacked parts 19, 21, etc. being damaged by handling.

Advantageously, method 1 thus provides improved fabrication precision, the possibility of fabricating high quality composite components in a flexible manner, i.e. components including several different materials of high quality without having to manipulate the parts of the final component in a very simple manner and with a multitude of plates. It is thus clear that method 1 may be entirely automated, for example, using a multi-station production line.

Figure 5:
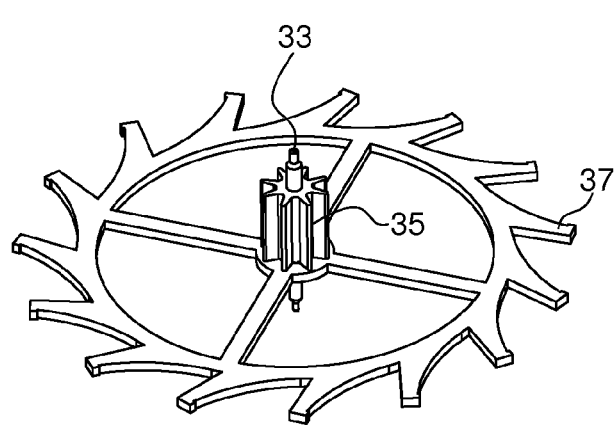
FIGS. 5 to 7 are schematic diagrams of micro-mechanical components that can be made via the method of the invention.
Figure 6:
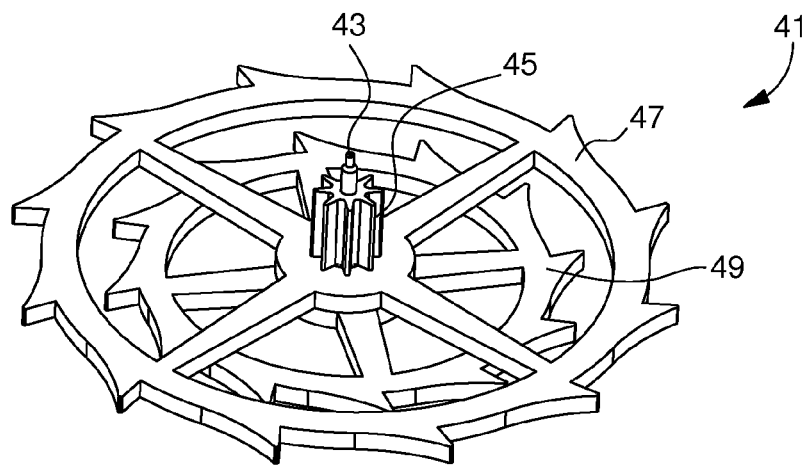
Figure 7:
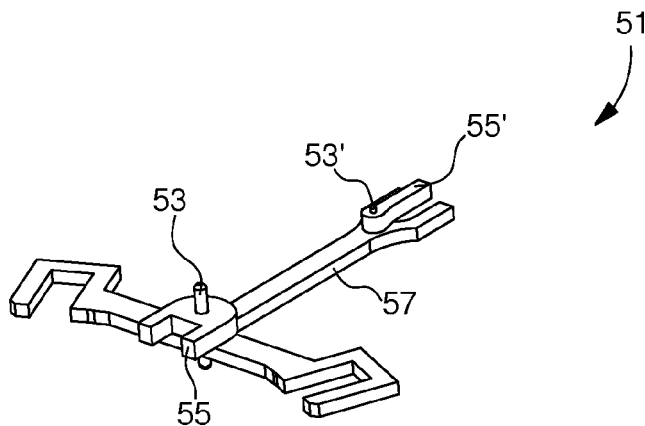

Micro-mechanical component fabrication examples in accordance with method 1 will now be presented with reference to FIGS. 5 to 7. In the example illustrated in FIG. 5, a timepiece wheel set 31 is shown including a pivoting arbour 33, a pinion 35 and a toothed wheel 37. Method 1 can, for example, allow pinion 35 to be a part of a plate obtained via an electroplating process and wheel 37 to be part of a plate obtained by a micro-machining process.

In the example illustrated in FIG. 6, a timepiece wheel set 41 is shown including a pivoting arbour 43, a pinion 45 and two toothed wheels 47, 49. Method 1 may, for example, allow pinion 45 to be a part of a plate obtained by an electroplating process and wheels 47, 49 to be parts of plates obtained by a micro-machining process.

Advantageously, according to the first variant explained above, pinions 35, 45 may also be integral with arbours 33, 43 respectively and thus form assemblies that can secure the final components 31, 41 in the third step 7 of method 1.

It is thus clear that a multitude of micro-mechanical components could be fabricated depending upon the materials used, the embodiments used and/or the variants chosen. Thus, by way of example, as illustrated in FIG. 7, one could also envisage fabricating a timepiece pallet assembly 51 that includes a pivoting arbour 53, a top arm 55, a main body 57, but also a guard-pin 55' and possibly a pin 53'.

Method 1 may, for example, allow pallet assembly 51 to be obtained using silicon-based parts alone. Pallet assembly 51 could be obtained from two plates made by a micro-machining process in step 3, stacked in step 5 on a support 23, with top arm 55 and guard-pin 55' being secured to main body 57 respectively by means of an arbour 53 and a pin 53' by bonding in step 7, pallet assembly 51 then being released from the plates by exerting a force on arbour 53 in final step 9.

Of course, the present invention is not limited to the illustrated example but may be subject to various variants and alterations, which will be apparent to those skilled in the art. In particular, in step 5 could include, as illustrated in FIG. 8 in double lines, an intermediate step 10 of depositing an adhesive material between each stacked plate 11, 13, etc., and/or ring 30. This adhesive material improves the local join between at two elements of the final component if necessary. The adhesive material may be deposited by a screen printing process, which allows deposition of a precise thickness and surface area.

Moreover, in order to provide the place where breakage occurs in step 9, as illustrated in FIG. 1, each bridge of material 12, 14 may include a narrow section at the end connected to its associated part 19, 21.

There may also be more or fewer arbour 22—recess 20, 26 assemblies. Further, these recesses 20, 26 may be replaced by recesses that already exist between frame 15, 17 and parts 19, 21 of plates 11, 13.

Finally, all of the components in the above explanation are mounted approximately vertically in each step purely to facilitate understanding of the invention. In fact, the direction of assembly of the components is not limited to directions A, A' or C. For example, in the case of fabrication of a pallet assembly 51, one could envisage mounting the pallet stones, before, during or after step 5 via a pierced side of frame 15, 17 of plate 11, 13, etc. used to form part 57 and/or top arm 55. Indeed, as the positioning of the pallet stones is very important, assembly against support 23 in phases 6, 8, etc. of step 5 may be used to mount the pallet stones very precisely in an approximately perpendicular direction to direction A, A', C. More generally, it is clear that at least one sub-part can be mounted on at least one of the parts laterally relative to the plate, before, during or after step 5.

Thus, as evident from the above description, the present invention relates broadly to a method (1) of fabricating a micro-mechanical component that includes the following step: (a) forming (3) at least one plate that includes a frame connected by at least one bridge of material to a part of the component, wherein the part has a hole. According to the invention, the method (1) also includes the following steps: (b) stacking (5) the at least one plate against a support; (c) securing (7) a pin in the hole of the at least one stacked part so as to form the component; and (d) releasing (9) the component formed from each plate. The invention concerns the field of watchmaking.

The invention claimed is:

1. A method of fabricating a micro-mechanical component having first and second parts that includes the following steps:
   (a) forming at least a first plate and a second plate, wherein the first plate includes a first frame connected by at least one bridge of material to the first part of the micro-mechanical component and the second plate includes a second frame connected by at least one bridge of material to the second part of the micro-mechanical component;
   (b) stacking the at least first plate and second plate against a support so as to stack the first part and the second part;
   (c) securing a single pin in a hole of each of the stacked first part and second part so as to form the micro-mechanical component with the single pin protruding from at least one of the stacked plates so the single pin is useable as gripping means so that only the first frame and the second frame and the single pin are handled during formation of the micro-mechanical component; and
   (d) releasing the formed micro-mechanical component from the at least first plate and second plate.

2. The method according to claim 1, wherein step (b) includes the following additional steps for each of the first plate and the second plate:
   (e) guiding the first plate and the second plate using respective alignment means in a guiding operation so as to orient each of the first plate and the second plate accurately relative to the support; and
   (f) sliding the first plate and the second plate against at least one arbour secured to the support until the first plate and the second plate abuts against a shoulder of the at least one arbour so as to place the first plate and the second plate accurately relative to the support.

3. The method according to claim 2, wherein the guiding operation of step (e) is performed using at least two alignment means so as to improve the accuracy of the guiding operation.

4. The method according to claim 2, wherein each alignment means includes at least one bevelled ring that is mounted in extension of said at least one arbour of the support, and the at least one bevelled ring cooperates with a recess made in each of the at least first plate and second plate formed in step (a).

5. The method according to claim 4, wherein each recess of the at least first plate and second plate is made in the respective frame of the at least first plate and second plate.

6. The method according to claim 4, wherein each recess is a space disposed between the respective frame and the respective part of each of the at least first plate and second plate.

7. The method according to claim 1, wherein each at least one bridge of material of the first part and the second part includes a narrow section at an end that is connected to the respective first part and second part of the micro-mechanical component so as to create an area of weakness that facilitates step (d).

8. The method according to claim 1, wherein several first parts are formed on the first plate and several second parts are formed on the second plate so as to form several micro-mechanical components in step (c).

9. The method according to claim 1, wherein the single pin is extended at each end thereof by a pivot-shank that includes a pivot to form a pivoting arbour.

10. The method according to claim 1, wherein at least one of the first plate and the second plate is formed in step (a) using an electroplating process.

11. The method according to claim 1, wherein at least one of the first plate and the second plate is formed in step (a) using a micro-machining process.

12. The method according to claim 1, wherein at least one sub-part is mounted laterally on at least one of the first part and the second part relative to the first plate or the second plate before, during or after step (b).

13. The method according to claim 1, wherein the formed micro-mechanical component is a timepiece wheel set or a timepiece pallet assembly.

14. A method of fabricating a micro-mechanical component having first and second parts that includes the following steps:
  (a) forming at least a first plate and a second plate, wherein the first plate includes a frame connected by at least one bridge of material to the first part of the micro-mechanical component and the second plate includes a frame connected by at least one bridge of material to the second part of the micro-mechanical component;
  (b) stacking the at least first plate and second plate against a support so as to stack the first part and the second part;
  (c) securing a single pin in a hole of each of the stacked first part and second part so as to form the micro-mechanical component with the single pin protruding from at least one of the stacked plates so the single pin is useable as gripping means, wherein the single pin has a coaxial ring used as a stop member for limiting penetration of the single pin in the hole of each of the stacked first part and second part; and
  (d) releasing the formed micro-mechanical component from the at least first plate and second plate.

15. The method according to claim 14, wherein said coaxial ring has a toothing so as to form a pinion.

* * * * *